United States Patent [19]

Ackland et al.

[11] Patent Number: 5,835,141
[45] Date of Patent: Nov. 10, 1998

[54] SINGLE-POLYSILICON CMOS ACTIVE PIXEL IMAGE SENSOR

[75] Inventors: Bryan David Ackland, Old Bridge; Alexander George Dickinson, Neptune; El-Sayed Ibrarhim Eid, Aberdeen; David Andrew Inglis, Long Branch, all of N.J.

[73] Assignee: Lucent Technologies Inc., Murray Hill, N.J.

[21] Appl. No.: 675,026

[22] Filed: Jul. 3, 1996

Related U.S. Application Data

[63] Continuation-in-part of Ser. No. 344,785, Nov. 22, 1994, Pat. No. 5,576,763.

[51] Int. Cl.$^6$ .................................................. H04N 5/335
[52] U.S. Cl. .......................................... 348/308; 257/290
[58] Field of Search ..................................... 348/294, 302, 348/303, 307, 308, 311, 313; 257/290, 234, 239, 369, 72; 377/60; H04N 5/335

[56] References Cited

U.S. PATENT DOCUMENTS

| 5,153,420 | 10/1992 | Hack et al. ............................ 250/208.1 |
| 5,355,165 | 10/1994 | Kosonocky et al. .................... 348/311 |
| 5,436,476 | 7/1995 | Hynecek ................................. 257/223 |
| 5,471,515 | 11/1995 | Fossum et al. . | |
| 5,631,704 | 5/1997 | Dickinson et al. ...................... 348/308 |

OTHER PUBLICATIONS

Fossum, E.R., "Active Pixel Sensors: Are CCD's Dinosaurs?," Proc. SPIE, v. 1900, *Charge–Coupled Devices and Solid State Optical Sensors III*, Feb. 2–3. 1993, San Jose, Ca., pp. 2–14.
Fossum, E.R., "Assessment of Image Sensor Technology for Future Nasa Missions," Proc. SPIE, v. 2172, *Charge–Coupled Devices and Solid State Optical Sensors IV*, pp. 1–16, (Feb., 1994 San Jose, Ca.).
Mendis et al., "CMOS Active Pixel Image Sensor," IEEE Transactions on Electron Devices, v.41 n.3, Mar. 1994, pp. 452–453.
Mendis et al., "CMOS Active Pixel Image Sensors for Highly Integrated Imaging Systems," Prepubl copy; accepted for publ. by IEEE J. Solid State Circuits, 18 pgs.
Mendis et al., "Progress in CMOS Active Pixel Image Sensors," Proc. SPIE, v.2172, *Charge–Coupled Devices and Solid State Optical Sensors IV*, pp. 19–29, (Feb., 1994 San Jose, Ca.).

*Primary Examiner*—Andrew I. Faile
*Assistant Examiner*—Tuan V. Ho

[57] ABSTRACT

A single-polysilicon active pixel, methods for operating and making same, and an imaging device employing same are disclosed. The single-polysilicon active pixel comprises a photo site located on a substrate for generating and storing charge carriers, the charge carriers being generated from photonic energy incident upon the photo site and semiconductor substrate, a photo gate, a transfer transistor and output and reset electronics. The gate of the transfer transistor and the photo gate are defined in a single layer of polysilicon disposed on the semiconductor substrate. The source of transfer transistor is a doped region of substrate, referred to as a coupling diffusion, which provides the electrical coupling between the photo gate and the transfer transistor. The coupling diffusion allows for the transfer of a signal stored in a photo site under the photo gate to the output electronics for processing. A plurality of such single-polysilicon active pixels can be arranged to form an imaging system. The single-polysilicon active pixel may be operated by biasing the transfer transistor to the low operating voltage of the pixel, for example, 0 volts. By virtue of the structure of the single-polysilicon active pixel, this mode of operation results in the same timing as if the transfer transistor were clocked, but neither a clock nor the associated driving circuitry arc required. However, there is little no tendency for image lag as occurs in double polysilicon active pixels when they are operated in a manner which avoids clocking the transfer gate.

20 Claims, 4 Drawing Sheets

SINGLE-POLYSILICON CMOS ACTIVE PIXEL IMAGE SENSOR

REFERENCE TO PARENT APPLICATION

This is a continuation-in-part of application Ser. No. 08/344,785, filed Nov. 22, 1994, U.S. Pat. No. 5,576,763.

FIELD OF THE INVENTION

This invention relates generally to CMOS active pixels, and more particularly to a single polysilicon active pixel.

BACKGROUND OF THE INVENTION

Solid state image sensors are presently realized in a number of forms. Charge coupled devices and MOS diode arrays, for example, are both based on a two dimensional array of pixels. Each pixel includes a sensing element that is capable of converting a portion of an optical image into an electronic signal. As photons strike the surface of a photo-active region, i.e., photo site, of the solid state image sensors, free charge carriers are generated and collected. Once collected, such charge carriers, referred to as a charge packet, must be moved to output circuitry for processing.

In charge coupled devices, the photo charges generated by each sensing element are transported by electronic shift registers to an output node at the perimeter of the array where an amplifier is typically located. In MOS diode arrays, the electronic shift registers are replaced with common conductors interconnecting pixels located in respective rows and columns. Typically, each common conductor interconnecting a column of pixels transports charge to a distinct amplifier located at the perimeter of the array.

Another class of solid state image sensors is a CMOS active pixel array. Like charge coupled devices and MOS diode arrays, each pixel in a CMOS active pixel array includes a sensing element capable of converting optical images into electronic signals. Unlike charge coupled devices and MOS diode arrays, each pixel in a CMOS active pixel array includes an amplifier for converting the photo-charge to an electronic signal prior to transferring the signal to a common conductor, which in turn conducts the signal to an output node.

In a typical CMOS active pixel, charge collection and transfer is accomplished as follows. The charge carriers can be collected in the photo site via a photo gate. The charge packet is stored in the photo site in spatially defined depletion regions or potential wells in the semiconductor substrate beneath the photo site. The charge packet is next transferred to an isolated diffusion region via a transfer gate. The diffusion region receives the charge from the photo gate well and further transfers it to the pixel amplifier for processing.

In a typical CMOS active pixel, charge packet transfer between wells occurs in the following manner. The near-surface potential within the semiconductor can be controlled by the potential of an electrode that is in close proximity to the semiconductor surface. If closely spaced electrodes are at different voltages, they will form potential wells of different depths. Free positive charges, for example, holes, will move from the region of higher potential to the one of lower potential. Free negative charges, for example, electrons, will move from the region of lower potential to one of higher potential. Accordingly, the potential on the photo gate and transfer gate may be adjusted to effect charge movement.

There is necessarily a gap between the photo gate and the transfer gate. If the gap is not narrow enough, the surface potential under the gap will constitute an electrical potential barrier for the transfer of the charge packet. If this occurs, there is no charge transfer. In other words, there is no signal read-out. Photo lithographic techniques presently dictate that a two-layer polysilicon structure is required to achieve a sufficiently narrow gap between surface electrodes. A two-layer structure requires at least two polysilicon deposition steps, the deposition of an insulating layer and two patterning steps.

It would be desirable to form an active pixel using a process wherein only one polysilicon deposition is required. This simple process would result in lower per chip fabrication cost. Furthermore, it would be desirable to operate such a pixel in a manner that minimizes hardware requirements while maintaining optimal pixel performance.

SUMMARY OF THE INVENTION

A CMOS active pixel characterized by a single layer of polysilicon for forming the photo gate and the transfer gate ("single-polysilicon active pixel"), a method for operating the pixel, and pixel arrays based on such a pixel are disclosed. According to one aspect of the present invention, the single-polysilicon active pixel comprises a photo site, a photo gate, a transfer transistor, and output and reset electronics. The photo gate and transfer transistor have a single layer structure of polysilicon. The source of the transfer transistor may be a doped region of substrate, referred to as a coupling diffusion, which provides the electrical coupling between the photo gate and the transfer transistor. The coupling diffusion allows for the transfer of a signal stored in the photo site under the photo gate to the output electronics for processing.

According to another aspect the invention, the single-polysilicon active pixel may be operated by biasing the gate of the transfer transistor to the ground potential of the pixel array, for example, 0 volts. The structure of the single-polysilicon active pixel allows for charge transfer, from the photosite to the pixel amplifier, with no active drive signal applied to the gate of the transfer transistor. This eliminates the need for a separate bias supply or clocking circuitry, as found in a double-polysilicon active pixels and photodiode pixel designs. Image lag is typically not observed in the single-polysilicon active pixel when operating it in this manner, as is observed in a double-polysilicon active pixel.

A single-polysilicon active pixel image sensor includes an array of single-polysilicon active pixels arranged in a first group and a second group. The first group may constitute a row and the second group may constitute a column, for example. A first common conductor is coupled to the pixels in the first group for conducting control signals. A second common conductor is coupled to the pixels in the second group for selectively transmitting, to output nodes, electronic data signals corresponding to portions of the image being converted.

Further features of the present invention will become more apparent from the following detailed description when read in conjunction with the accompanying drawings.

DETAILED DESCRIPTION OF THE INVENTION

Before discussing the single-polysilicon CMOS active pixel 36 of the present invention, it will be useful to discuss the structure and operation of a typical double-polysilicon active pixel.

Figure 1:
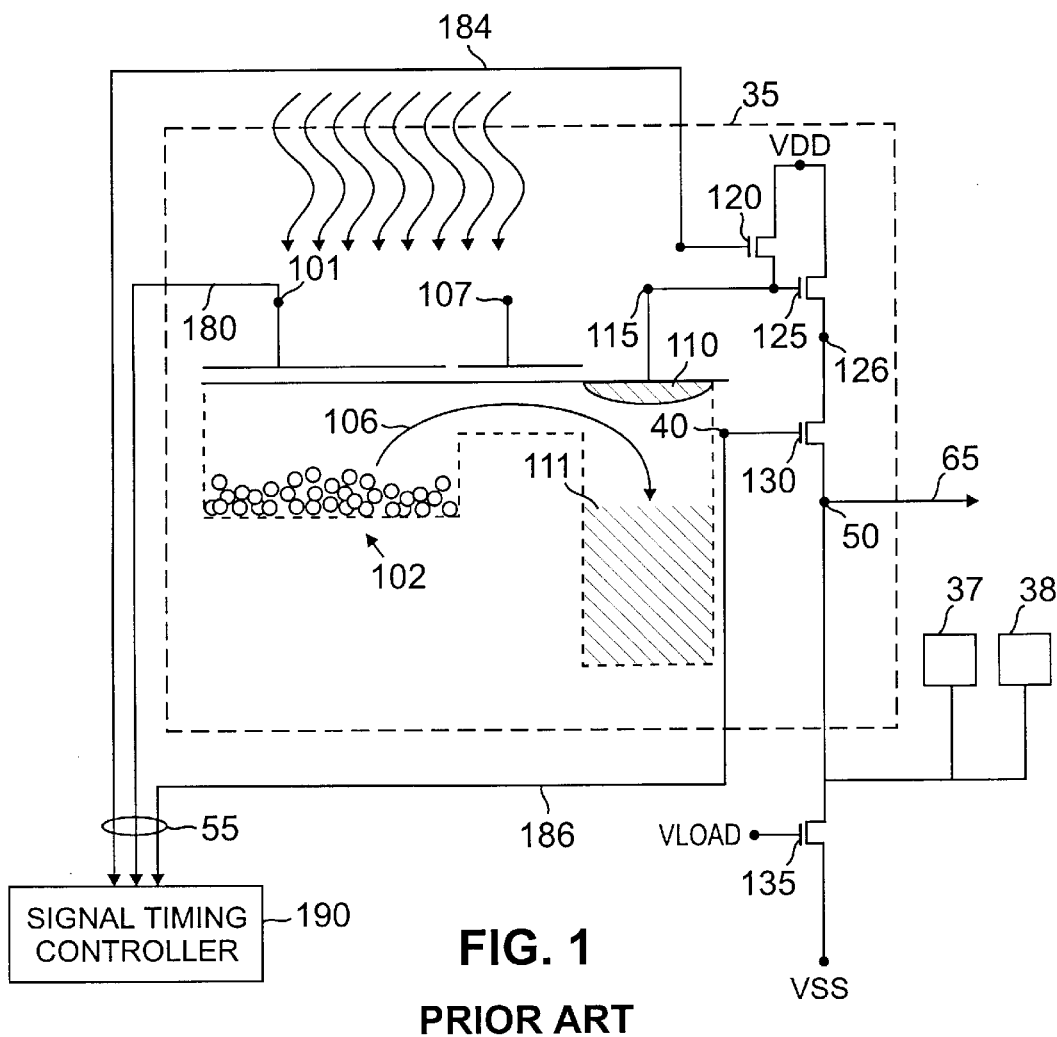
FIG. 1 is a schematic of a known active pixel utilizing a double polysilicon structure.
Figure 2:
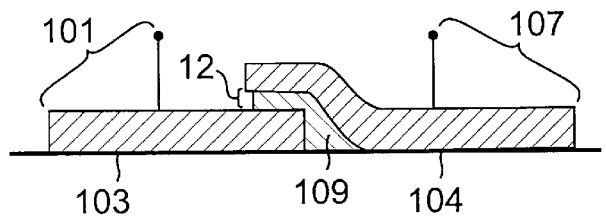
FIG. 2 illustrates the two-layer structure of the active pixel of FIG. 1.

A schematic and electron transfer diagram of a prior art double-polysilicon CMOS active pixel 35 is shown in FIG. 1. FIG. 1 does not, however, illustrate the double polysilicon layer. Details of the double polysilicon layer are shown in FIG. 2.

Referring to FIG. 1, the active pixel 35 includes a photo gate 101 charge-coupled to a transfer gate 107 that is charge-coupled to a diffusion region 110. The active pixel 35 further includes a reset transistor 120, an amplifier formed by a voltage follower-transistor 125, and a select transistor 130. A load, such as a suitably biased load transistor 135 may be included as part of the pixel. Typically, the active pixel 35 will be one of a plurality of such active pixels forming an array. As such, is it preferable to use a single load transistor 135 that is common to a other active pixels in a column of active pixels, such as, for example, the pixels 37 and 38. While two additional pixels 37 and 38 are shown, it will be understood that many more pixels can be included depending upon the application of the invention.

A floating diffusion node 115 connects the diffusion region 110 to the reset transistor 120 and the voltage-follower transistor 125. The reset and voltage-follower transistors are further connected to a fixed voltage VDD which may be, for example, five volts. The reset transistor 120 is also connected to a reset control line 184 from an external signal timing controller 190. The reset control line 184 constitutes part of the control line 55 shown in FIG. 2. The voltage-follower transistor 125 is further connected to the select transistor 130 which is electrically connected to the load transistor 135.

The load transistor 135 is also connected to a fixed load voltage VLOAD, and a fixed voltage VSS which may be, for example, zero volts. The select transistor 130 is further connected to a select control line 186 from the signal timing controller 190. The select control line 186 constitutes another part of the control line 55. The signal timing controller may be a timing circuit, a combinational logic circuit or any other circuit capable of generating the necessary timing signals to the active pixel. The load voltage VLOAD should be adjusted such that a desired resistance is achieved across the load transistor 135 between the node 50 and the fixed voltage VSS. Accordingly, suitable alternatives for the load transistor 135 include a resistor or any other passive or active device that can provide the required electrical resistance when disposed between the node 50 and the fixed voltage VSS.

The active pixel output 50 that generates the output signal is the connection point between the select transistor 130 and load 135. The pixel output line 65 connects the pixel output 50 to an output circuit, such as the differential output circuit described in U.S. patent application Ser. No. 08/323203 filed on Oct. 14, 1994 and incorporated herein by reference.

FIG. 1 includes an electron well diagram showing charge carriers 102 beneath the photo gate 101, charge carrier transfer arrow 106 and transferred charge carriers 111 in the diffusion region 110. This diagram represents the transfer of electrical charge from the region under the photo gate 101, which may be referred to as a photo site, to the transfer channel under the transfer gate 107 to the diffusion region 110. The transfer of charge will be discussed in more detail below.

The double-polysilicon structure, illustrated in FIG. 2, provides the electrical coupling required for transferring charge from the semiconductor substrate region 103 under the photo gate 101 and to the region 104 under the transfer gate 107. The substrate surface potential under the photo gate 101 is controlled by the voltage applied to the photo gate 101. Similarly, the substrate surface potential under the transfer gate 107 is controlled by the voltage applied to the transfer gate 107. Charge transfer from the region 103 to the region 104 and finally to the diffusion region 110 is achieved by applying a different voltage to the photo gate 101 and the transfer gate 107. If the gap 12 between the photo gate 101 and the transfer gate 107 is not narrow enough, the substrate potential under the gap 12 will constitute a barrier for the transfer of the charge.

To form the double polysilicon arrangement, a first layer of polysilicon is deposited on the substrate. The polysilicon is then patterned, and a contact is attached. The patterned polysilicon and contact collectively form the photo gate 101. A thin layer of an insulating material, typically silicon dioxide, is then grown. Next, a second layer of polysilicon is deposited. The second deposition is then patterned and a contact is attached. The patterned second deposition and the contact collectively form the transfer gate 107. The transfer gate 107 may overlap the photo gate 101. As shown in FIG. 2, the gap 12 separating the photo gate 101 and the transfer gate 107 is as narrow as the thickness of the silicon dioxide layer 109, which is typically on the order of a few tens of nanometers (nm). This narrow gap is essential for proper electrical coupling.

The active pixel may be either an n-channel device with electrons as the photo-generated charge carriers or a p-channel device with holes as the photo-generated charge carriers. For the balance of this description, the active pixel is assumed to be an n-channel device.

The signal timing controller 190 generates reset, select and photo gate control signals on lines 184, 186 and 180 causing the double-polysilicon active pixel to operate in two phases, integration and read-out. In the integration phase, the generated charge carriers are collected under the photo gate 101 for a predetermined period, referred to as the integration time. The integration time is dictated by the frame rate, or in other words, the number of times per second an image is updated, of the particular imaging application for which the active pixel is being used. For example, for commercial video applications, the frame rate is 30 frames per second. Thus, the integration time is about 1/30 of a second. The charge carriers are collected by clocking the photo gate 101 to a relatively high voltage level, such as VDD. During the integration phase, the transfer gate 107 is turned off.

In the read-out phase, the reset transistor 120 is pulsed on and off. This pulsing causes the potential of the diffusion node 115 to float at a level approximately equal to VDD less the threshold voltage. Then, the bias of the photo gate 101 is changed to approximately VSS, for example, 0 volts, causing charge transfer to the diffusion node 115. Charge transfer causes the potential of the diffusion node 115 to deviate from its value, approximately VDD, or in other words, the reset level, to another value which is dictated by the photo-generated charge. This other value is the signal level. The difference between the reset and signal levels is proportional to the incident light intensity and constitutes a video signal. The voltage-follower transistor 125 amplifies the video signal by an amount sufficient to overcome the relatively large load offered by the common output conductor 65. The voltage-follower transistor 125, in conjunction with the load transistor 135 also serve to buffer the diffusion node 115 from the output 50 of the active pixel sensor 35.

The select transistor 130 is used as a switch to select the pixel for read-out. In this phase, the transfer gate 107 is turned on to allow the transfer of the signal charge from under the photo gate 101 into the diffusion node 115. It is turned off, however, after completion of transfer and before the photo gate is clocked high for the following integration, ensuring that none of the signal charge will transfer back to the region under the photo gate 101 causing image lag.

The transfer gate 107 should be clocked on and off as described above for the optimum operation of the pixel. Alternatively, it is known to operate the pixel by biasing the transfer gate 107 to a voltage approximately halfway between VSS and VDD, or in other words, about 2 to 2.5 volts for a typical application so that the transfer channel is slightly conducting. This biasing simplifies operation by eliminating the need for one control clock and the associated driving circuitry. But, some of the charge signal may transfer back to under the photo gate 101 resulting in image lag, especially at high charge signal levels.

While in FIG. 1 the select transistor 130 receives an amplified signal from the voltage follower transistor 125 and selectively provides this signal to the common output conductor 65, other amplifier arrangements can also be employed. For example, an arrangement can be used in which the switching and amplifying functions occur in the opposite order from that discussed above. That is, a switch can selectively transmit to the amplifier the signal from the diffusion node. The amplifier in turn may provide the amplified signal to the common conductor 65. After the charge signal read-out, the output 50 signal is processed and amplified to provide the output video signal.

This completes a description of a known CMOS active pixel. As previously noted, it would be desirable to fabricate a CMOS active pixel by depositing a single layer of polysilicon for forming the photo gate and the transfer gate. If, however, the photo gate 101 and the transfer gate 107 of known CMOS active pixels are formed in this manner, the gap between the photo gate and the transfer gate would be approximately one micron ($\mu$m). A one micron gap is too wide to provide the required electrical coupling. In one embodiment of the present invention, a CMOS active pixel comprises a photo gate and a transfer gate characterized by a single non-overlapping layer of polysilicon.

Figure 3:
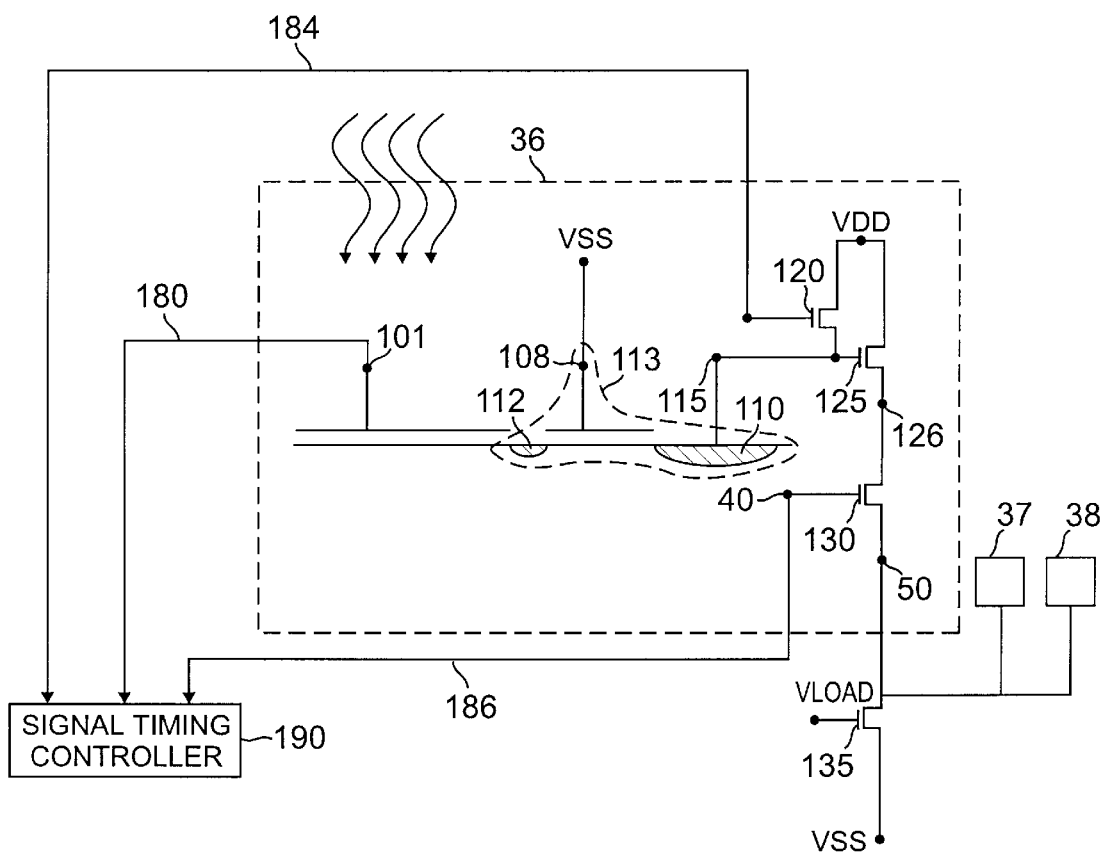
FIG. 3 is a schematic of a single-polysilicon active pixel according to the present invention.

One such single-polysilicon CMOS active pixel 36 according to the present invention is shown in FIG. 3. The elements of the single-polysilicon active pixel are similar to those of the "double-polysilicon" active pixel. The photo gate and the transfer gate of the single-polysilicon active pixel are not, however, characterized by two overlapping layers of polysilicon like known CMOS active pixels. Rather, the single-polysilicon active pixel 36 has a coupling diffusion region 112 situated between the photo gate and the transfer gate. When properly biased as discussed further below, the coupling diffusion region functions as a conduction channel between the substrate regions 103 and 104, shown in FIG. 4, thus providing the required electrical coupling.

The coupling diffusion region 112, the diffusion region 110 and the transfer gate function collectively as a transistor; the coupling diffusion region 112 as the source and the diffusion region 110 as the drain. Thus, a transfer transistor 113 is formed comprising the coupling diffusion region 112, a diffusion region 110, and a transfer transistor gate 108.

Figure 4:
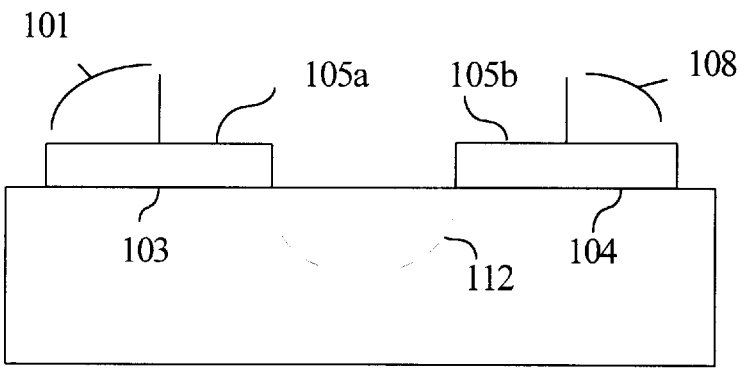
FIG. 4 is an illustration of the single-layer structure of the single-polysilicon active pixel of the present invention.

To form the photo gate 101 and the transfer transistor gate 108 according to the present invention, a layer of polysilicon is deposited on a semiconductor substrate. The polysilicon is then patterned into two regions, 105a and 105b, using an appropriate mask and contacts are attached. The region 105a and its associated contact define the photo gate 101, and the region 105b and its associated contact define the transfer transistor gate 108, as shown in FIG. 4. Masking techniques used for patterning the polysilicon are well known to those skilled in the art. The coupling diffusion region 112 and the diffusion region 110 may suitably be formed in the same ways that the source and drain regions of a transistor are typically formed.

The coupling diffusion region 112 increases the kTC noise of the pixel. This effect can be minimized by making the coupling diffusion region capacitance as low as possible by making the area of the coupling diffusion region 112 as small as possible. It is expected that the coupling diffusion region capacitance can be made as low as a few femto-Farads, which equates to kTC noise on the order of a few tens of electrons.

The single-polysilicon CMOS active pixel 36 can be operated in a manner similar to that of the double-polysilicon CMOS active pixel. For example, the transfer transistor 113 may be turned on and off in a manner similar to that of the transfer gate 107. Alternatively, the transfer transistor may be biased with a potential approximately halfway between VSS and VDD so that it is slightly conducting. As in the case of the double-polysilicon active pixel, the latter operating mode results in a trade-off between operating simplicity and image lag.

Figure 5:
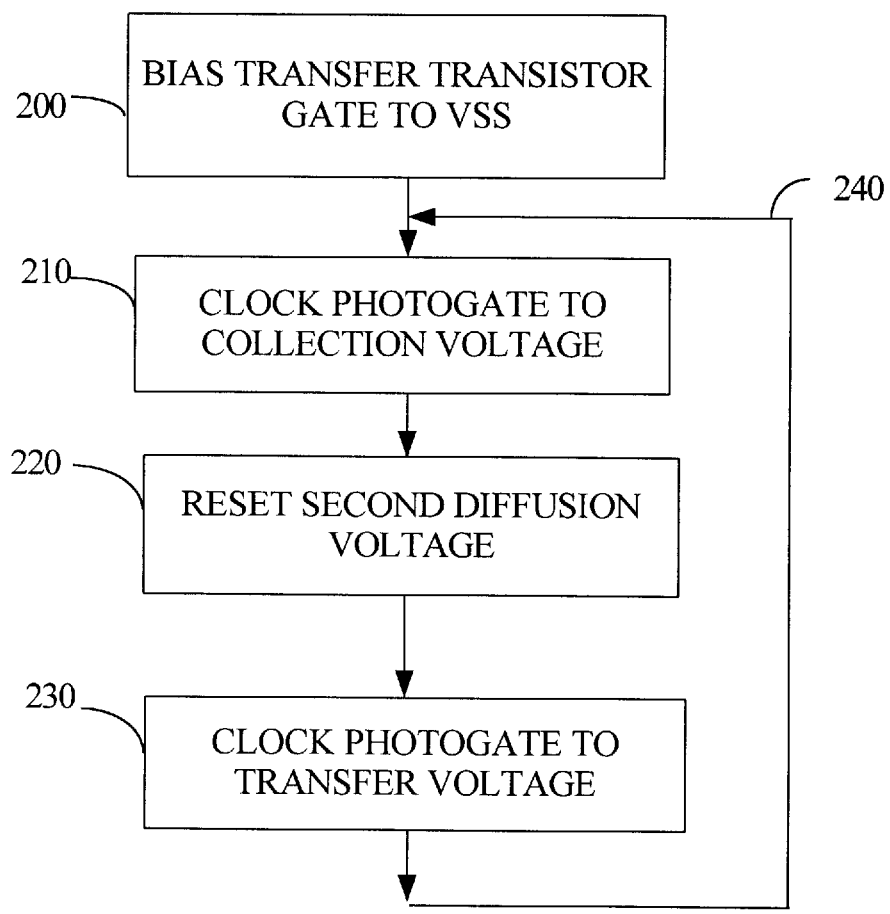
FIG. 5 is a flow chart illustrating a method of operating the single-polysilicon active pixel of FIG. 3 according to the present invention.

In considering the single-polysilicon CMOS active pixel 36, a novel mode of operation has been discovered. As shown in FIG. 5 and described below, a presently preferred method of operation is as follows. In step 200, the transfer transistor gate 108 is biased to VSS, typically 0 volts. In step 210, the photo gate 101 is clocked high by applying a voltage such as 5 volts, and the photo-generated electrons are collected. During collection, the transfer transistor 113 is off. This is because the gate-to-source voltage is zero, and thus lower than the threshold voltage. In step 220, which occurs near the end of the integration time, the potential on the diffusion region 110 is reset. This resetting may be accomplished in the same manner as for the double-polysilicon pixel. For example, a reset transistor 120 may be pulsed on and off, causing the potential of the diffusion node 115 to float at a level approximately equal to VDD less the threshold voltage. Finally, in step 230, the photo gate 101 is clocked low by applying a voltage such as 0 volts, so that the electrons are transferred out of the region under the photo gate 101.

Without being limited to a particular theory of operation, it is believed that the pixel operates as follows when the transfer transistor gate is biased to VSS. Once the photo gate 101 is clocked low, the potential of the coupling diffusion region 112 goes slightly negative as it gets flooded by the electrons as they flow from the region under the photo gate 101. As the coupling diffusion region 112 potential decreases or becomes negative, the gate-to-source voltage of the transfer transistor 113 increases or becomes positive. Concurrently, because of the body effect, the threshold voltage of the transfer transistor 113 decreases. This mechanism remains in effect until the gate-to-source voltage exceeds the threshold voltage causing the transfer transistor 113 to turn on. As the transfer transistor turns on, the electrons flow from the coupling diffusion region 112 to the diffusion node 115. The flow of the electrons continues until the potential of the coupling diffusion region 112 decreases to its previous level, that is, its potential before the transfer of the signal electrons from the region under the photo gate 101, causing the transfer transistor 113 to turn off. The pixel is then ready to process another image by repeating the aforementioned steps as indicated by line 240.

Biasing the transfer transistor gate 108 to VSS causes the transfer transistor 113 to be off all the time except when the electrons are transferred from under the photo gate 101 into the diffusion node 115. This is effectively the same timing as if the transfer transistor 113 were clocked. Neither a clock nor its associated driving circuitry is required, however. Further, because the transfer transistor gate 108 is biased to VSS, i.e., nominally zero volts, there is no tendency to lag as when the transfer gate is biased to a voltage intermediate between VDD and VSS.

This mode of operation, which may be referred to as virtual clocking of the transfer transistor, is less sensitive to very low signal levels, for example, less than about one-half of one percent of the signal saturation level. If the signal level is in this range, the potential of the coupling diffusion region 112 will not become negative enough to cause the transfer transistor 113 to turn on. To this end, the capacitance of the coupling diffusion region 112 must therefore be made as low as possible.

Note that the potential of the coupling diffusion region 112 does not get sufficiently negative to cause the coupling diffusion/substrate junction to be forward biased. The transfer transistor 113 turns on before the coupling diffusion-substrate junction potential exceeds its built-in value, causing this junction to remain reverse-biased as the transfer transistor turns on and then off.

The single-polysilicon CMOS active pixel 36 of the present invention may be comprised of the same elements that are used in a double polysilicon active pixel for providing read-out, reset and buffering functions. For example, the single-polysilicon CMOS active pixel may incorporate a reset transistor 120, a voltage-follower transistor 125, select transistor 130 and a load, such as a suitably biased load transistor 135. Alternatively, the load transistor need not be included in the pixel 36 but may be common to a column of such pixels. These elements are arranged to operate in a manner similar to their operation in the double-polysilicon active pixel. The photo gate 101, the reset transistor 120 and the select transistor 130 are controlled, as appropriate, by a signal from the signal timing controller 190 sent over lines 180, 184 and 186, respectively.

Figure 6:
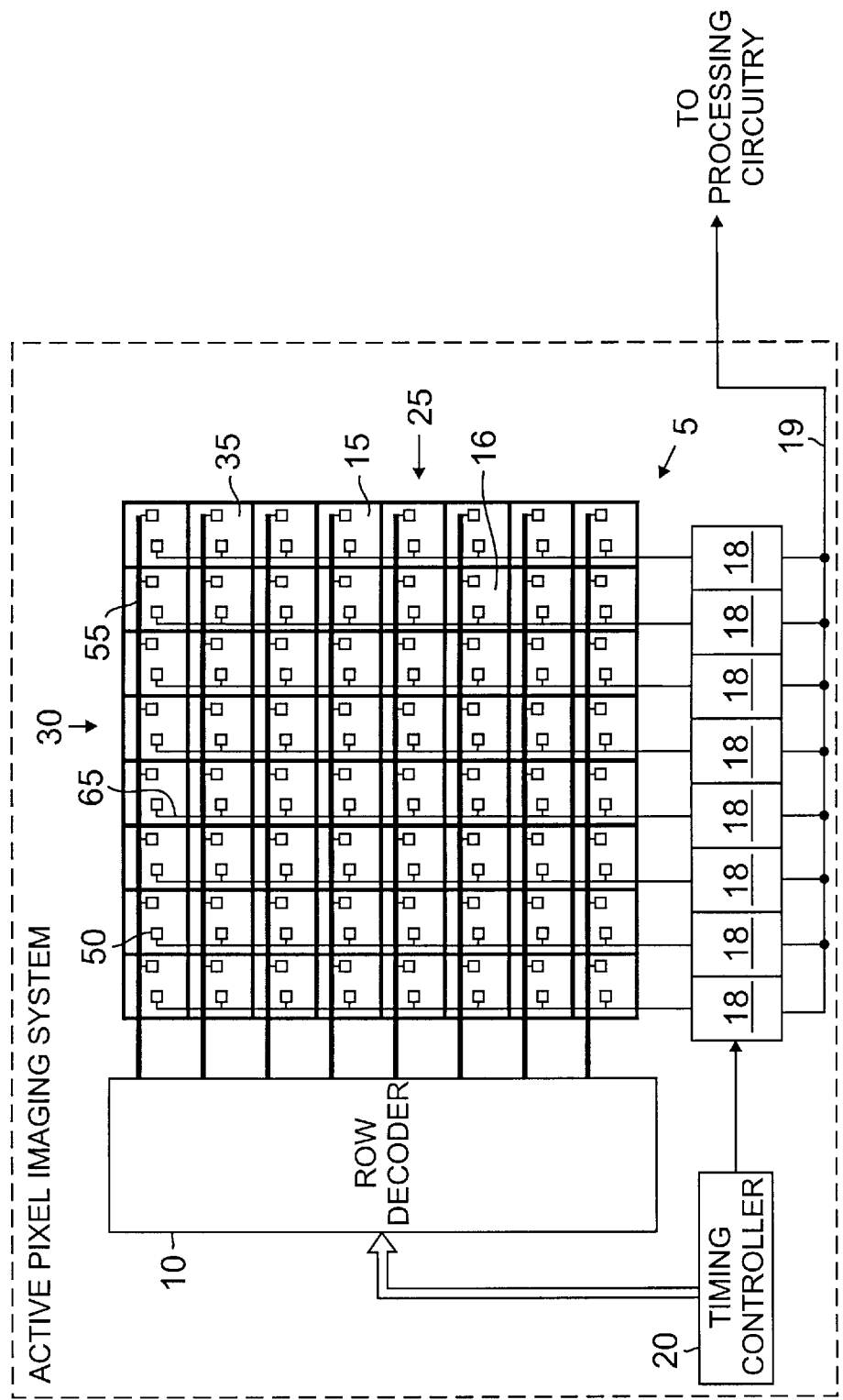
FIG. 6 is a schematic of an exemplary active pixel image sensor according to the present invention.

A plurality of single polysilicon active pixels 36 according to the present invention may be arranged to form a single-polysilicon active pixel imaging system, such as the exemplary imaging system 1 shown in FIG. 6. Such an imaging system may be used as a solid-state camera. The imaging system 1 includes an array 5 of active pixels, a row decoder 10 and a plurality of output amplifiers 18. The array 5 includes a series of columns 30 and rows 25 of closely spaced active pixels 35. The individual active pixels 35 can be characterized as either a peripheral pixel, such as the pixel 15, or, alternatively, as an interior pixel, such as the pixel 16. It should be appreciated that the ten-by-ten pixel array 5 is shown for illustrative purposes and is not intended as a limitation on the present invention. A pixel array according to the present invention may consist of any number of rows and columns of single-polysilicon active pixels. Moreover, the pixels may be arranged in groups other than rows and columns.

The pixels in each row 25 are connected to a common conductor 55 serving as a control line that includes a reset control line 184, a select control line 186 and a photo gate control line 180. The aforementioned control lines are shown in FIG. 3. The active pixel output 50 that generates the output signal is the connection point between the select and load transistors 130 and 135, respectively. The pixel output 50 is connected to the column output line 65.

Each active pixel output 50 in a corresponding column 30 is connected by a common conductor 65 serving as a column output line to a particular amplifier 18. The circuitry of the row decoders, such as the row decoder 10, and amplifiers, such as the amplifier 18, are well known to those skilled in the art.

In operation, a timing controller 20 provides timing signals to the row decoder 10. In response, the decoder 10 sequentially activates each row 25 of active pixels 35 via the control lines 55 to detect light intensity and to generate corresponding output voltage signals during each frame interval. In the context of an array of pixels, the term "frame" refers to a single complete cycle of activating and sensing the output from each pixel 35 in the array a single time over a predetermined frame time period. The timing of the imaging system is controlled to achieve a desired frame rate, such as 30 frames per second.

When detecting a particular frame, each row 25 can be activated to detect light intensity over a substantial portion of the frame interval. In the time remaining after the row 25 has detected the light intensity for the frame, each of the respective pixels simultaneously generates output voltage signals corresponding to the amount of light selected by that pixel 35. If an image focused on the array 5 by, for example, a conventional camera lens, then each pixel 35 generates an output voltage signal corresponding to the light intensity for a portion of the image focused on that pixel 35. The output voltage signals generated by the activated row 35 are simultaneously provided to the corresponding amplifiers 18 via the column output line 65. Output signals from the amplifiers 18 are provided to the common output line 19 in serial fashion based on timing control signals from the timing control 20. The output signals are routed to suitable processing circuitry, not shown.

Although a number of specific embodiments of this invention have been shown and described herein, it is to be understood that these embodiments are merely illustrative of the many possible arrangements that can be devised in application of the principles of the invention. Numerous and varied other arrangements can be devised in accordance with these principles by those of ordinary skill in the art in view of the present teachings without departing from the scope and spirit of the invention. For example, while in a preferred embodiment, only a single polysilicon layer is used in conjunction with the transfer transistor arrangement described herein to form a single-polysilicon active pixel, the transfer transistor arrangement could be used in conjunction with a double-polysilicon structure to form a double-polysilicon active pixel.

We claim:

1. A CMOS active pixel for converting an optical signal to an electronic signal, comprising:
   a semiconductor substrate wherein charge carriers are generated from incident photonic energy;
   a photo gate for collecting the charge carriers, the photo gate having a contact electrically connected to a first region of polysilicon;
   a transfer transistor gate for transferring charge between the photo gate and output electronics, the transfer transistor gate having a contact electrically connected to a second region of polysilicon, said second region of polysilicon having a first side and a second side;
   a transfer transistor comprising the transfer transistor gate, a first diffusion region and a second diffusion region, wherein the first diffusion region is within the substrate between the first region of polysilicon and the first side of the second region of polysilicon, and wherein the second diffusion region is within the substrate nearest the second side of the second region of polysilicon;
   reset electronics electrically connected to the second diffusion region; and
   output electronics, electrically connected to the second diffusion region, which receive the charge transferred by the transfer transistor gate and conduct the signal to processing electronics.

2. The CMOS active pixel of claim 1 wherein the photo gate and the transfer transistor gate are formed from a single layer of polysilicon.

3. The single polysilicon CMOS active pixel of claim 2 wherein the output electronics comprise a voltage follower transistor electrically connected to a select transistor, wherein the voltage follower transistor is electrically connected to the second diffusion.

4. The single polysilicon CMOS active pixel of claim 2 wherein the reset electronics comprises a reset transistor.

5. A single-polysilicon active pixel imaging device comprising:
   an array of single-polysilicon active pixels arranged in a first group and a second group;
   a first common conductor coupled to the active pixels in the first group for conducting control signals;
   a second common conductor coupled to the active pixels in the second group for selectively transmitting signals to processing electronics; wherein,
   each of the single-polysilicon active pixels comprises:
     a semiconductor substrate wherein charge carriers are generated from incident photonic energy;
     a photo gate for collecting the charge carriers, the photo gate having a contact electrically connected to a first region of polysilicon;
     a transfer transistor gate for transferring charge between the photo gate and output electronics, the transfer transistor gate having a contact electrically connected to a second region of polysilicon, said second region of polysilicon having a first side and a second side;
     a transfer transistor comprising the transfer transistor gate, a first diffusion region and a second diffusion region, wherein the first diffusion region is within the substrate between the first region of polysilicon and the first side of the second region of polysilicon, and wherein the second diffusion region is within the substrate nearest the second side of the second region of polysilicon; and
   an amplifying arrangement for selectively receiving signals from the plurality of active pixels and selectively providing output signals to the second common conductor.

6. The single-polysilicon active pixel imaging device of claim 5 wherein the active pixel has a N-channel configuration.

7. The single-polysilicon active pixel imaging device of claim 5 wherein the amplifying arrangement comprises a voltage follower transistor electrically connected to a select transistor, wherein the voltage follower transistor is electrically coupled to the second diffusion region.

8. The single-polysilicon active pixel imaging device of claim 7 further comprising a reset transistor electrically coupled to the second diffusion region and the first common conductor.

9. The single-polysilicon active pixel imaging device of claim 8 further comprising a load transistor coupled to the voltage follower transistor in a source follower configuration.

10. The single-polysilicon active pixel imaging device of claim 5 wherein the amplifying arrangement is CMOS.

11. The single-polysilicon active pixel imaging device of claim 7 wherein the amplifying arrangement is CMOS.

12. The single-polysilicon active pixel imaging device of claim 5 wherein the first group forms a row and the second group forms a column.

13. The single-polysilicon active pixel imaging device of claim 12 further comprising a plurality of rows and columns.

14. The single-polysilicon active pixel imaging device of claim 5 wherein the amplifying arrangement comprises an amplifier and a switch for selectively transmitting the output signal from the amplifier to the second common conductor.

15. A method for operating a single-polysilicon CMOS n-channel active pixel having a photo gate, a clock, and a transfer transistor which has a transfer transistor gate and a diffusion node, the single-polysilicon CMOS active pixel operable by a first voltage and a second voltage, comprising the steps of:
   (a) biasing the transfer transistor to the second voltage;
   (b) clocking the photo gate to the first voltage, the first voltage on the photo gate being maintained until a first desired period of time has elapsed, wherein a signal is stored in a first region during the first desired period of time;
   (c) resetting the diffusion node to a third voltage based on the first voltage;
   (d) clocking the photo gate to the second voltage when the first desired period of time has elapsed, and maintaining the second voltage until a second desired period of time has elapsed, wherein, during the second desired period of time, the signal is transferred out of the first region to the diffusion node changing the third voltage on the diffusion node; and
   (e) repeating steps (b)–(d).

16. The method of claim 15 wherein the first voltage has a higher potential than the second voltage.

17. The method of claim 15 wherein the first voltage is 5 volts and the second voltage is 0 volts.

18. The method of claim 15 wherein the second voltage is 0 volts.

19. The method of claim 15 wherein the first desired period of time is about 30 milliseconds.

20. The method of claim 15 wherein the step of resetting the diffusion node comprises activating a reset transistor, which reset transistor has a drain biased to the first voltage and has a source electrically connected to the diffusion node.

* * * * *